(12) United States Patent
Nagata et al.

(10) Patent No.: US 9,380,733 B2
(45) Date of Patent: Jun. 28, 2016

(54) COOLING DEVICE AND POWER MODULE EQUIPPED WITH COOLING DEVICE

(71) Applicants: Yuichi Nagata, Tokyo (JP); Kenji Kato, Tokyo (JP); Toshiki Tanaka, Tokyo (JP)

(72) Inventors: Yuichi Nagata, Tokyo (JP); Kenji Kato, Tokyo (JP); Toshiki Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/766,175

(22) PCT Filed: Feb. 20, 2013

(86) PCT No.: PCT/JP2013/054207
§ 371 (c)(1),
(2) Date: Aug. 6, 2015

(87) PCT Pub. No.: WO2014/128868
PCT Pub. Date: Aug. 28, 2014

(65) Prior Publication Data
US 2015/0382509 A1 Dec. 31, 2015

(51) Int. Cl.
*H05K 7/20* (2006.01)
*H01L 23/373* (2006.01)
(Continued)

(52) U.S. Cl.
CPC ............ *H05K 7/20409* (2013.01); *H01L 23/36* (2013.01); *H01L 23/373* (2013.01);
(Continued)

(58) Field of Classification Search
CPC ..... H05K 7/20; H05K 7/205; H05K 7/20409; H01L 23/36; H01L 23/373; H01L 23/427; H01L 31/0368; F28F 7/00; B21D 53/01; B21D 53/02; G06F 1/20
USPC ....... 361/679.46, 679.54, 704–712, 361/715–724, 746, 751, 757, 761, 762; 165/80.2, 80.3, 80.4, 104.33, 135, 185, 165/170; 257/706, 707, 712, 713, 717–722, 257/727; 428/32.69, 112, 408, 448, 378, 428/593, 614, 295.4, 209, 339; 438/106, 438/122, 339, 690, 692; 29/890.039
See application file for complete search history.

(56) References Cited

U.S. PATENT DOCUMENTS 6,661,317 B2 * 12/2003 Ali .................... H01L 23/373
157/E23.11
7,228,894 B2 * 6/2007 Moore ................. H01L 23/36
165/185

(Continued)

FOREIGN PATENT DOCUMENTS

EP     2 551 324 A1    1/2013
JP     02-174564 A     7/1990
(Continued)

OTHER PUBLICATIONS

Notice of Rejection of Japanese Application No. 2015-501143 dated Apr. 15, 2015.
(Continued)

*Primary Examiner* — Michail V Datskovskiy
(74) *Attorney, Agent, or Firm* — Sughrue Mion, PLLC

(57) ABSTRACT

A cooling device includes a power module incorporating chips that generate heat and having chip arrangement in which a first chip having the largest amount of heat generation and second chips having the second largest amount of heat generation are not adjacent to each other and the first chip is adjacent to any two of third chips having the smallest amount of heat generation, a heat sink, to a base surface of which the power module is closely attached, and flat first and second anisotropic high heat conductors having a thermal conductivity higher than a main body disposed on the surface of the heat sink. The first and second anisotropic high heat conductors are separated into two and disposed under the first chip and under the second chips.

5 Claims, 9 Drawing Sheets

(51) Int. Cl.
- *H01L 25/07* (2006.01)
- *H01L 23/36* (2006.01)
- *G06F 1/20* (2006.01)
- *H01L 23/427* (2006.01)
- *H01L 25/18* (2006.01)

(52) U.S. Cl.
CPC ............ *H01L23/3733* (2013.01); *H01L 25/07* (2013.01); *H01L 25/072* (2013.01); *H05K 7/205* (2013.01); *H01L 23/427* (2013.01); *H01L 25/18* (2013.01); *H01L 2924/0002* (2013.01)

(56) References Cited

U.S. PATENT DOCUMENTS

| | | | | |
|---|---|---|---|---|
| 7,808,787 | B2 * | 10/2010 | Lemak | H01L 23/373 165/185 |
| 7,859,848 | B1 * | 12/2010 | Lemak | H01L 23/373 165/185 |
| 8,059,408 | B2 * | 11/2011 | Lemak | H01L 23/373 165/185 |
| 8,063,484 | B2 * | 11/2011 | Kuroda | H01L 23/367 257/675 |
| 8,085,531 | B2 * | 12/2011 | Lemak | H01L 23/373 165/185 |
| 2004/0104446 | A1 | 6/2004 | Yoshizaki et al. | |
| 2005/0006754 | A1 | 1/2005 | Arik et al. | |
| 2007/0159864 | A1 | 7/2007 | Yoshizaki et al. | |
| 2009/0067132 | A1 * | 3/2009 | Lemak | H01L 23/373 361/708 |
| 2009/0096561 | A1 * | 4/2009 | Menjo | H01F 1/0552 335/302 |
| 2010/0134016 | A1 | 6/2010 | York et al. | |
| 2011/0215349 | A1 | 9/2011 | An et al. | |
| 2011/0303399 | A1 | 12/2011 | Sakimichi et al. | |
| 2013/0016479 | A1 | 1/2013 | Hougham et al. | |
| 2014/0367078 | A1 | 12/2014 | Burger et al. | |

FOREIGN PATENT DOCUMENTS

| | | |
|---|---|---|
| JP | 08-186203 A | 7/1996 |
| JP | 2004-040900 A | 2/2004 |
| JP | 2006-202798 A | 8/2006 |
| JP | 2007-019130 A | 1/2007 |
| JP | 2010-526408 A | 7/2010 |
| JP | 2010-251427 A | 11/2010 |
| JP | 2011-159662 A | 8/2011 |
| JP | 2011-258755 A | 12/2011 |
| JP | 2012-069670 A | 4/2012 |
| JP | 2012-084907 A | 4/2012 |
| TW | 201203633 A1 | 1/2012 |

OTHER PUBLICATIONS

International Search Report of PCT/JP2013/054207 dated May 14, 2013 [PCT/ISA/210].

Communication dated Aug. 24, 2015 from the Intellectual Property Office of Taiwan issued in corresponding Taiwanese application No. 10421126680.

* cited by examiner

COOLING DEVICE AND POWER MODULE EQUIPPED WITH COOLING DEVICE

CROSS REFERENCE TO RELATED APPLICATIONS

This application is a National Stage of International Application No. PCT/JP2013/054207, filed Feb. 20, 2013, the contents of which are incorporated herein by reference in its entirety.

FIELD

The present invention relates to a cooling device and a power module equipped with the cooling device and, more particularly, to a cooling device for a power module on which power semiconductor chips are mounted.

BACKGROUND

Conventionally, a technique has been disclosed in which the motor drive is mainly controlled by configuring an inverter circuit from a power module on which power semiconductor chips are mounted and by performing a switching operation on direct-current power and thereby converting the direct-current power into alternating-current power (Patent Literature 1). An electric current instantaneously flows to only a few specific chips in the power module to generate heat. However, the heat-generating chips are instantaneously switched; therefore, usually, the chips generate heat equally. On the other hand, in particular, in driving of a servomotor, there are many cases, such as a case of holding a heavy object, where electric power is supplied to the motor without involving rotation of the motor. In such cases, an electric current concentratedly flows to a few specific chips in a module and the amount of heat generation locally increases. There is a demand for a cooling device having high heat radiation properties that can efficiently and quickly diffuse and radiate heat even in such cases.

As such a cooling device, conventionally, there is a cooling device in which a material having a high thermal conductivity is used to obtain a structure having high heat radiation properties. For example, in Patent Literature 1, a heat radiation plate is configured from two graphite layers. A high thermal conductivity is obtained in the horizontal direction in the first layer and obtained in the vertical direction in the second layer, thereby increasing the heat radiation properties.

CITATION LIST

Patent Literature

Patent Literature 1: Japanese Patent Application Laid-Open No. 2012-069670

SUMMARY

Technical Problem

However, according to the conventional technique described above, there is a problem in that, when the module is reduced in size by, for example, use of a wide band gap semiconductor and a few chips having a large amount of heat generation are disposed close to one another, heat interference among the chips occurs and the temperature of the chips rises.

In Patent Literature 1, because the thermal conductivity in the vertical direction of the first graphite layer is low, the thickness in the vertical direction of the first layer has to be reduced. Therefore, the thermal conduction properties in the horizontal direction are also deteriorated and thus it is difficult to immediately uniformly diffuse heat to the end of a heat sink. Because directions in which the thermal conductivity is high are limited to the two directions in this way, there is a problem in that it is difficult to diffuse heat to the entire heat sink.

The present invention has been devised in view of the above and it is an object of the present invention to obtain a cooling device that can immediately diffuse heat to the entire heat sink without causing heat interference among heat chips that generate heat and to obtain a power module including the cooling device.

Solution to Problem

In order to solve the above problems and achieve the object, an aspect of the present invention is a cooling device for cooling a power module including first and second chips that generate heat, the cooling device comprising a heat sink including a base surface on which the power module is closely attached and mounted, wherein the heat sink includes: a main body including the base surface; and first and second high heat conductors that have a thermal conductivity higher than a thermal conductivity of the main body, and the first and second chips are respectively in contact with one ends of the first and second high heat conductors and respectively connected to independent heat dispersion routes via the first and second high heat conductors.

Advantageous Effects of Invention

The cooling device according to the present invention attains an effect that, even when the amount of heat generation locally increases in a few specific chips, the first chip having the largest amount of heat generation can be cooled without substantially being affected by the second chip having the second largest amount of heat generation and thus it is possible to immediately uniformly diffuse heat to the entire heat sink.

BRIEF DESCRIPTION OF DRAWINGS

FIG. 1-2 is an enlarged perspective view of a main part of the power module equipped with the cooling device according to the first embodiment of the present invention.

FIG. 2-1 is an enlarged perspective view showing another example of the power module according to the first embodiment of the present invention.

FIG. 2-2 is an enlarged perspective view showing another example of the power module according to the first embodiment of the present invention.

FIG. 2-3 is an enlarged perspective view showing another example of the power module according to the first embodiment of the present invention.

FIG. 2-4 is an enlarged perspective view showing another example of the power module according to the first embodiment of the present invention.

FIG. 2-5 is an enlarged perspective view showing another example of the power module according to the first embodiment of the present invention.

FIG. 3 is a perspective view showing a power module equipped with a cooling device according to a second embodiment of the present invention.

FIG. 4 is a perspective view showing a power module equipped with a cooling device according to a third embodiment of the present invention.

FIG. 5 is a perspective view showing a power module equipped with a cooling device according to a fourth embodiment of the present invention.

DESCRIPTION OF EMBODIMENTS

Figure 1:
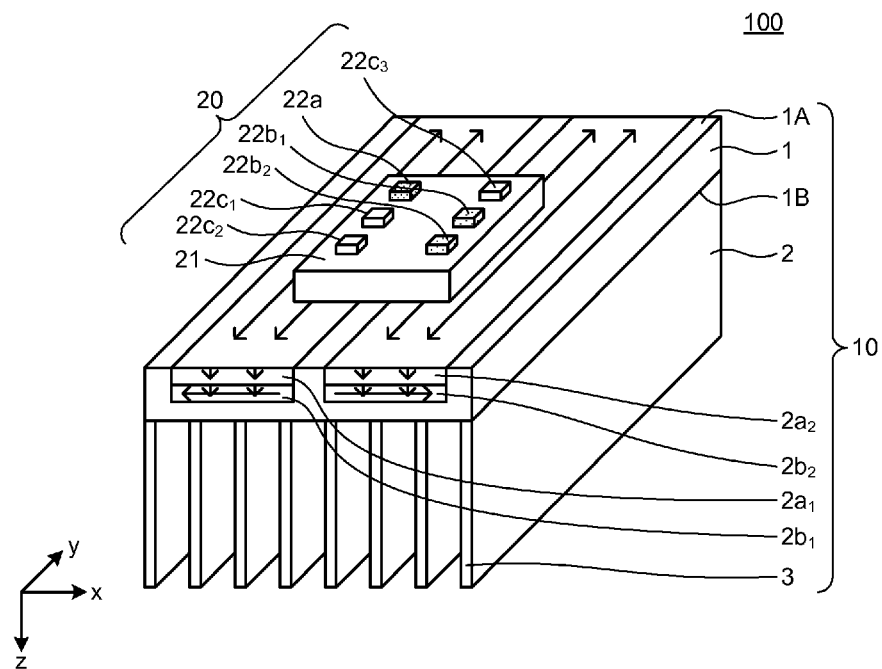
FIG. 1-1 is a perspective view showing a power module equipped with a cooling device according to a first embodiment of the present invention.

Exemplary embodiments of a cooling device and a power module equipped with the cooling device according to the present invention are explained in detail below with reference to the drawings. Note that the present invention is not limited to the embodiments and can be modified as appropriate without departing from the scope of the invention. In the drawings explained below, for easier understanding, scales of respective members may be shown differently from those of actual products.

First Embodiment.

Figures 1, 2:
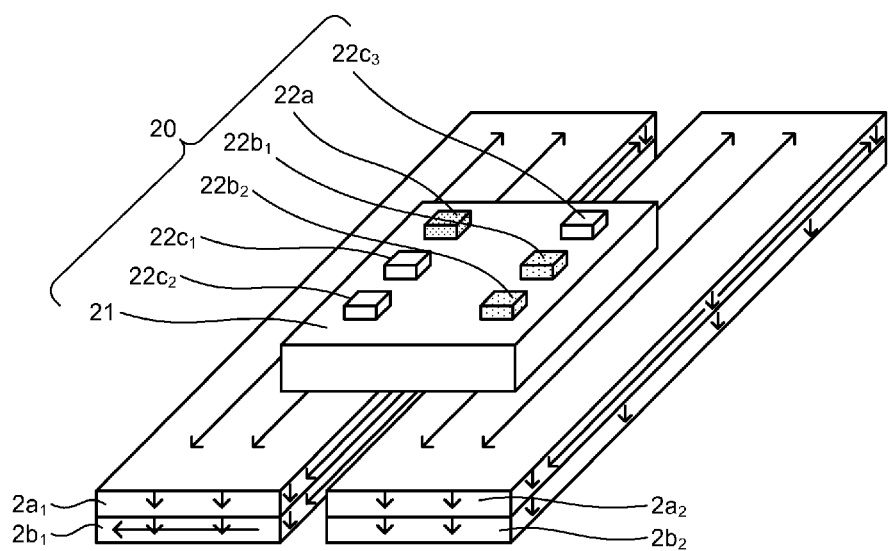

FIG. 1-1 is a perspective view of a power module equipped with a cooling device according to a first embodiment. FIG. 1-2 is an enlarged perspective view of a main part of the power module used in the present embodiment. As shown in FIG. 1-1, a power module 100 equipped with a cooling device in the first embodiment is configured from a power module 20 and a cooling device 10 for cooling the power module 20. The cooling device 10 includes a heat sink 2 including a base surface 1A on which the power module 20 is closely attached and mounted. The heat sink 2 includes a main body 1 including the base surface 1A and first and second high heat conductors (first and second anisotropic high heat conductors $2a_1$, $2a_2$, $2b_1$, and $2b_2$) having a thermal conductivity higher than that of the main body 1. The present embodiment is characterized in that first and second chips are respectively in contact with one ends of the first and second high heat conductors and connected to independent two groups of heat dispersion routes via the first and second anisotropic high heat conductors respectively as indicated by arrows.

The cooling device 10 includes the heat sink 2 configured from a plurality of flat fins 3 made of, for example, aluminum and the main body 1. The power module 20 is provided on the base surface 1A, which is a surface opposite to a formation surface 1B of the flat fins 3 of the main body 1. The power module 20 configures, for example, an inverter circuit and performs a switching operation on direct-current power to convert the direct-current power into alternating-current power, thereby controlling the motor drive. In the power module 20, six chips made of power semiconductors functioning as heat generating bodies are mounted on a wiring board 21. Usually, an electric current instantaneously flows to only a few specific chips in the power module 20 to generate heat. However, the heat-generating chips are instantaneously switched; therefore, the chips generate heat equally. On the other hand, for example, in driving of a servomotor, there are cases, such as a case of holding a heavy object, where electric power is supplied to the motor without involving rotation of the motor. In such cases, an electric current concentratedly flows to a few specific chips in a module and the amount of heat generation locally increases. The power module 20 is configured from six chips, i.e., a first chip 22a having the largest amount of heat generation when heat generation is locally concentrated, second chips $22b_1$ and $22b_2$ having the second largest amount of heat generation, and third chips $22c_1$, $22c_2$, and $22c_3$ having the smallest amount of heat generation.

The chip layout is such that the first chip 22a and the second chip $22b_1$ and the second chip $22b_2$ are disposed not to be adjacent to each other and the first chip 22a is disposed adjacent to the third chip $22c_1$ and the third chip $22c_3$. The second chip $22b_1$ and the second chip $22b_2$ are not disposed along the row in the y direction in which the first chip 22a is included.

The first anisotropic high heat conductor $2a_1$ and the first anisotropic high heat conductor $2b_1$ are provided immediately below the region including the first chip 22a. The second anisotropic high heat conductor $2a_2$ and the second anisotropic high heat conductor $2b_2$ are provided immediately below the region including the second chip $22b_1$ and the second chip $22b_2$. Note that the first anisotropic high heat conductor $2a_1$ and the second anisotropic high heat conductor $2a_2$ having a high thermal conductivity in the y direction and the z direction and having a low thermal conductivity in the x direction are disposed immediately below the power module 20. The first anisotropic high heat conductor $2b_1$ and the second anisotropic high heat conductor $2b_2$ having a high thermal conductivity in the x direction and the z direction and having a low thermal conductivity in the y direction are disposed under the first anisotropic high heat conductor $2a_1$ and the second anisotropic high heat conductor $2a_2$ and are closely attached to the heat sink 2. As the anisotropic high heat conductors, for example, a graphite material having a thermal conductivity equal to or higher than 1000 W/mK in a direction in which the thermal conductivity is high can be used.

In such the cooling device 10, when the electric current concentratedly flows to a few specific chips as explained above, the first chip 22a instantaneously and locally has the largest amount of heat generation, the second chip $22b_1$ and the second chip $22b_2$ have the second largest amount of heat generation, and the third chip $22c_1$, the third chip $22c_2$, and the third chip $22c_3$ hardly generate heat. Therefore, the generated heat of the first chip 22a is transferred to the first anisotropic high heat conductor $2a_1$ through the wiring board 21 of the power module 20, diffused in the y direction and the z direction, and further diffused in the x direction and the z direction by the first anisotropic high heat conductor $2b_1$ and transferred to the heat sink 2. Therefore, it is possible to suppress an instantaneous temperature rise of the first chip 22a. The generated heat of the second chip $22b_1$ and the second chip $22b_2$ is transferred to the second anisotropic high heat conductor $2a_2$ through the wiring board 21 of the power module 20, diffused in the y direction and the z direction, and further diffused in the x direction and the z direction by the second anisotropic high heat conductor $2b_2$ and transferred to the heat sink 2. Therefore, it is possible to suppress an instantaneous temperature rise of the second chip $22b_1$ and the second chip $22b_2$.

The high heat conductor immediately below the first chip 22a and the high heat conductor immediately below the second chip $22b_1$ and the second chip $22b_2$ are separated from each other to configure independent two groups of heat dispersion routes. Therefore, when the amount of heat generation instantaneously increases according to the switching operation, the heat of the second chip $22b_1$ and the second chip $22b_2$ is mainly diffused inside the second anisotropic high heat conductor $2a_2$ and the second anisotropic high heat conductor $2b_2$. If the high heat conductors are not separated from each other, because two chips, i.e., the second chip $22b_1$ and the second chip $22b_2$, generate heat and thus the heat generation area is large, the heat is easily diffused to the region immediately below the first chip $22a$ and this affects cooling of the first chip $22a$. In contrast, in the present embodiment, because the high heat conductors are separated from each other, the heat of the second chip $22b_1$ and the second chip $22b_2$ less easily flows into the region immediately below the first chip $22a$. Therefore, the generated heat of the first chip $22a$ is efficiently diffused inside the first anisotropic high heat conductor $2a_1$ and the first anisotropic high heat conductor $2b_1$. Consequently, it is possible to suppress an instantaneous temperature rise of the first chip $22a$.

Note that the total amount of heat generation of the second chip $22b_1$ and the second chip $22b_2$ and the amount of heat generation of the first chip $22a$ are approximately the same. Therefore, heat quantities transferred to the separated high heat conductors are equivalent. Consequently, it is possible to uniformly diffuse heat to the entire heat sink 2 and thus it is possible to efficiently perform cooling.

FIG. 2-1 to FIG. 2-5 are perspective views showing modifications of the power module according to the first embodiment of the present invention. The configuration when the chips generate heat according to a switching operation is not limited to the layout configuration shown in FIG. 1-1 and FIG. 1-2. As shown in FIG. 2-1 to FIG. 2-5, the chips only have to be disposed such that the first chip $22a$ and the second chip $22b_1$ and the second chip $22b_2$ are not adjacent to each other and the first chip $22a$ is adjacent to the third chip $22c_1$, the third chip $22c_2$, and the third chip $22c_3$.

Second Embodiment.

Figures 1, 2:
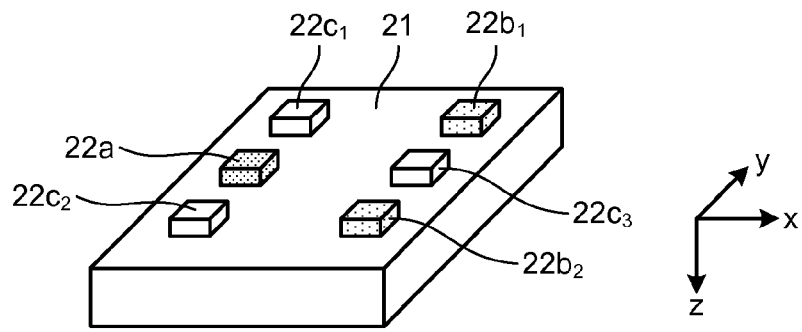
Figure 2:
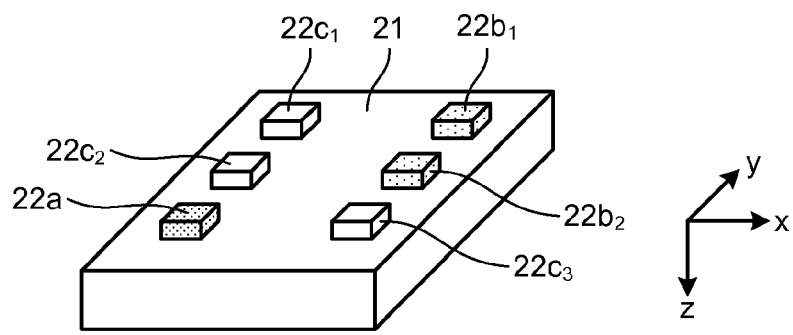
Figures 2, 3:
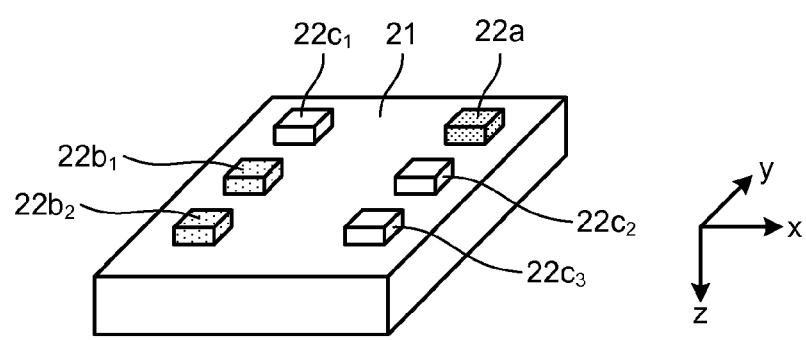

FIG. 3 is a perspective view of a power module equipped with a cooling device according to a second embodiment of the present invention. As shown in FIG. 3, in the second embodiment, the order of high heat conductors to be stacked is opposite to the order in the first embodiment. The first anisotropic high heat conductor $2b_1$ and the second anisotropic high heat conductor $2b_2$ having a high thermal conductivity in the x direction and the z direction and having a low thermal conductivity in the y direction are disposed immediately below the power module 20. The first anisotropic high heat conductor $2a_1$ and the second anisotropic high heat conductor $2a_2$ having a high thermal conductivity in the y direction and the z direction and having a low thermal conductivity in the x direction are disposed under the first anisotropic high heat conductor $2b_1$ and the second anisotropic high heat conductor $2b_2$ and closely attached to the heat sink 2.

In such the cooling device 10, the generated heat of the first chip $22a$ is transferred to the first anisotropic high heat conductor $2b_1$ through the wiring board 21 of the power module 20, diffused in the x direction and the z direction, and further diffused in the y direction and the z direction by the first anisotropic high heat conductor $2a_1$ and transferred to the heat sink 2. Therefore, it is possible to suppress an instantaneous temperature rise of the first chip $22a$. The generated heat of the second chip $22b_1$ and the second chip $22b_2$ is transferred to the second anisotropic high heat conductor $2b_2$ through the wiring board 21 of the power module 20, diffused in the x direction and the z direction, and further diffused in the y direction and the z direction by the second anisotropic high heat conductor $2a_2$ on the lower layer side and transferred to the heat sink 2. Therefore, it is possible to suppress an instantaneous temperature rise of the second chip $22b_1$ and the second chip $22b_2$.

As in the first embodiment, the high heat conductor immediately below the first chip $22a$ and the high heat conductor immediately below the second chip $22b_1$ and the second chip $22b_2$ are separated from each other. Therefore, the heat of the second chip $22b_1$ and the second chip $22b_2$ less easily flows into the region immediately below the first chip $22a$. Thus, the generated heat of the first chip $22a$ is efficiently diffused inside the first anisotropic high heat conductor $2b_1$ and the first anisotropic high heat conductor $2a_1$. Consequently, it is possible to suppress an instantaneous temperature rise of the first chip $22a$.

Note that the layout arrangement of the heat-generating chips is not limited to the configuration shown in FIG. 3 and can be the configurations shown in FIG. 2-1 to FIG. 2-5.

Third Embodiment.

Figures 2, 3, 4:
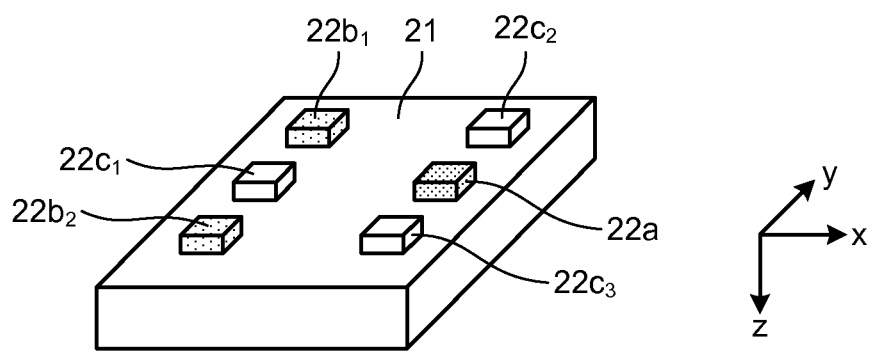

FIG. 4 is a perspective view of a power module equipped with a cooling device according to a third embodiment of the present invention. In the first and second embodiments, the anisotropic high heat conductors having the same size are stacked. However, as shown in FIG. 4, the present embodiment is characterized in that the size of the anisotropic high heat conductors disposed on the power module 20 side is reduced to approximately the same size as the power module in the y direction in which the thermal conductivity is low. That is, the size of the first anisotropic high heat conductor $2b_1$ and the second anisotropic high heat conductor $2b_2$ having a high thermal conductivity in the x direction and the z direction and having a low thermal conductivity in the y direction, which are disposed on the power module side, is set to correspond to the size of the power module 20 in the y direction. The first anisotropic high heat conductor $2a_1$ and the second anisotropic high heat conductor $2a_2$ having a high thermal conductivity in the y direction and the z direction and having a low thermal conductivity in the x direction are disposed under the first anisotropic high heat conductor $2b_1$ and the second anisotropic high heat conductor $2b_2$ and closely attached to the heat sink 2 with the size thereof corresponding to the size of the heat sink 2.

In such the cooling device 10, as in the cooling device 10 in the second embodiment, the generated heat of the first chip $22a$ is transferred to the first anisotropic high heat conductor $2b_1$ through the wiring board 21 of the power module 20, diffused in the x direction and the z direction, and further diffused in the y direction and the z direction by the first anisotropic high heat conductor $2a_1$ and transferred to the heat sink 2. Therefore, it is possible to suppress an instantaneous temperature rise of the first chip $22a$. The generated heat of the second chip $22b_1$ and the second chip $22b_2$ is transferred to the second anisotropic high heat conductor $2b_2$ through the power module 20, diffused in the x direction and the z direction, and further diffused in the y direction and the z direction by the second anisotropic high heat conductor $2a_2$ and transferred to the heat sink 2. Therefore, it is possible to suppress an instantaneous temperature rise of the second chip $22b_1$ and the second chip $22b_2$.

As in the second embodiment, the high heat conductor immediately below the first chip $22a$ and the high heat conductor immediately below the second chip $22b_1$ and the second chip $22b_2$ are separated from each other. Therefore, the heat of the second chip $22b_1$ and the second chip $22b_2$ less easily flows into the region immediately below the first chip $22a$. Thus, the generated heat of the first chip $22a$ is efficiently diffused inside the first anisotropic high heat conductor $2b_1$ and the first anisotropic high heat conductor $2a_1$. Consequently, it is possible to suppress an instantaneous temperature rise of the first chip $22a$.

In this case, the first anisotropic high heat conductor $2b_1$ and the second anisotropic high heat conductor $2b_2$ have a role of spreading heat in the x direction. Therefore, even if the length in the y direction corresponds to the size of the power module 20, the ability of spreading heat in the x direction is not hindered. Thus, the amount of high heat conductors to be used is reduced and therefore it is possible to reduce costs.

Note that, in the present embodiment as well, the layout arrangement of the heat-generating chips in the power module 20 is not limited to the configuration shown in FIG. 4 and can be the configurations shown in FIG. 2-1 to FIG. 2-5.

Fourth Embodiment.

Figures 2, 3, 4, 5:
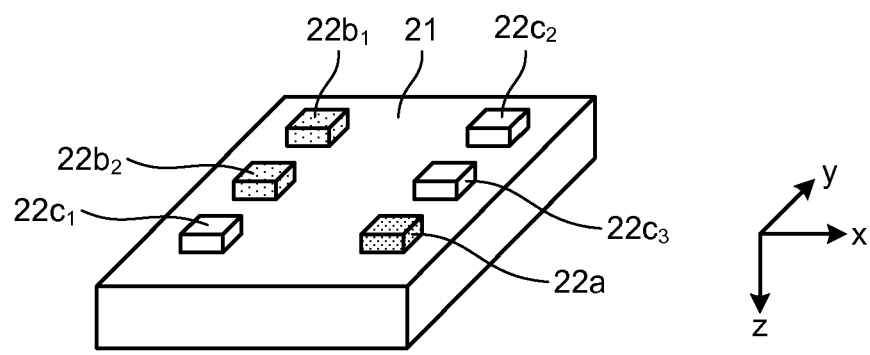
Figure 3:
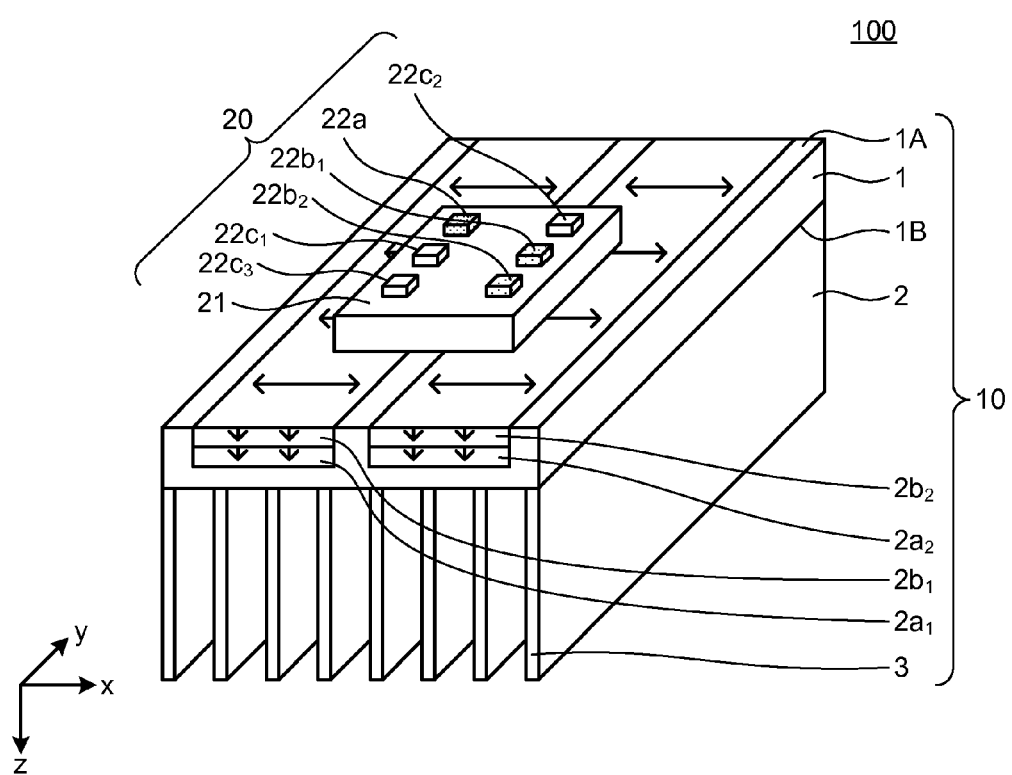
Figure 4:
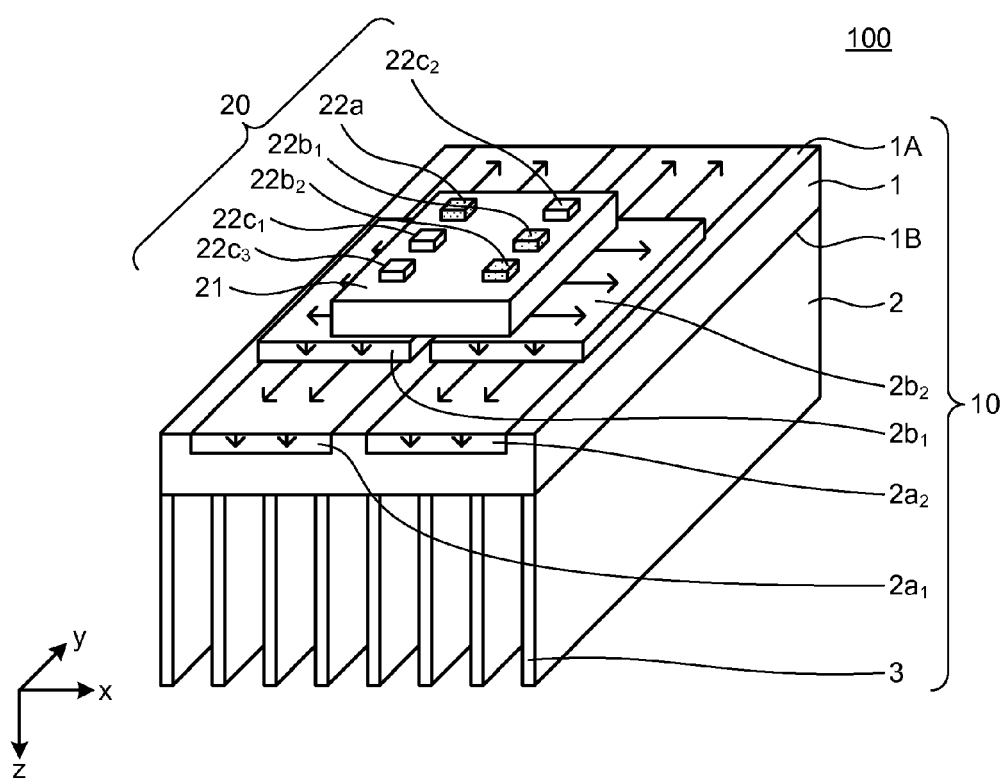
Figure 5:
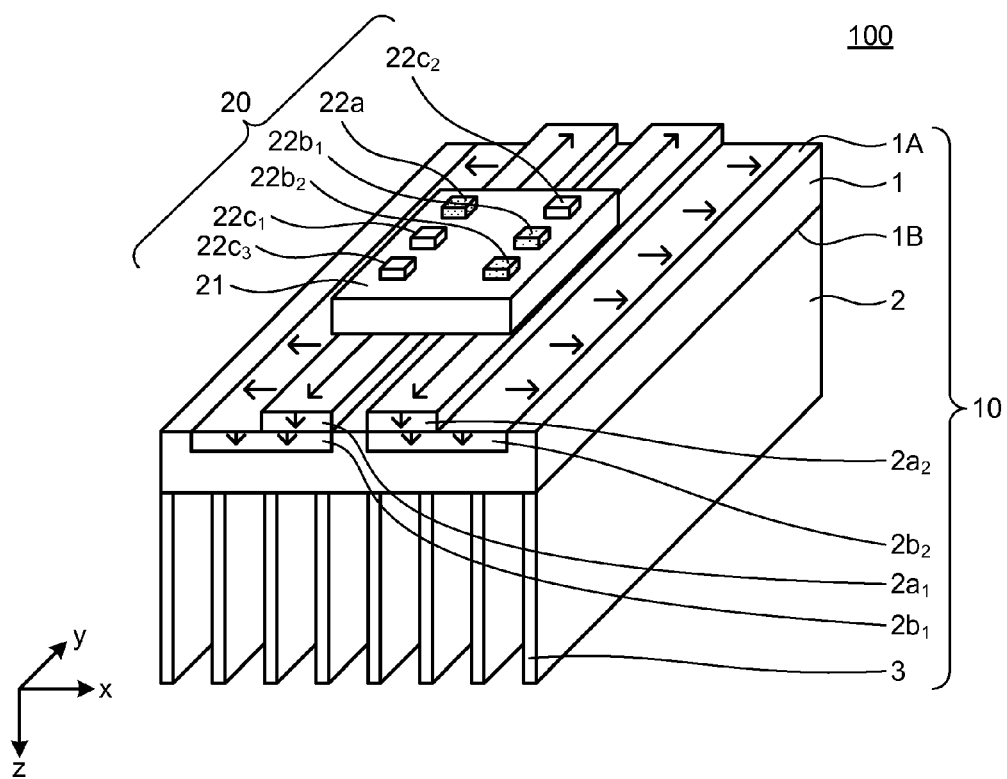

FIG. 5 is a perspective view of a power module equipped with a cooling device according to a fourth embodiment of the present invention. In the third embodiment, among the anisotropic high heat conductors of the stacked structure, the size of the anisotropic high heat conductors having a low thermal conductivity in the y direction disposed on the power module 20 side is reduced in the y direction. However, in the present embodiment, as shown in FIG. 5, the anisotropic high heat conductors disposed on the power module 20 side have a low thermal conductivity in the x direction. The present embodiment is characterized in that, in the x direction in which the thermal conductivity is low, the size of the anisotropic high heat conductors is reduced to approximately the size matching the outer edge of the wiring board 21 of the power module. That is, as shown in FIG. 5, in the fourth embodiment, the size of the first anisotropic high heat conductor $2a_1$ and the second anisotropic high heat conductor $2a_2$ having a high thermal conductivity in the y direction and the z direction and having a low thermal conductivity in the x direction, which are disposed on the power module 20 side, among the high heat conductors to be stacked, is reduced in accordance with the size of the wiring board of the power module 20 in the x direction. The first anisotropic high heat conductor $2b_1$ and the second anisotropic high heat conductor $2b_2$ having a high thermal conductivity in the x direction and the z direction and having a low thermal conductivity in the y direction are disposed under the first anisotropic high heat conductor $2a_1$ and the second anisotropic high heat conductor $2a_2$ and closely attached to the heat sink 2 with the size thereof corresponding to the size of the heat sink 2.

In such the cooling device 10, as in the cooling device 10 in the first embodiment, the generated heat of the first chip $22a$ is transferred to the first anisotropic high heat conductor $2a_1$ through the wiring board 21 of the power module 20, diffused in the y direction and the z direction, and further diffused in the x direction and the z direction by the first anisotropic high heat conductor $2b_1$ and transferred to the heat sink 2. Therefore, it is possible to suppress an instantaneous temperature rise of the first chip $22a$. The generated heat of the second chip $22b_1$ and the second chip $22b_2$ is transferred to the second anisotropic high heat conductor $2a_2$ through the power module 20, diffused in the y direction and the z direction, and further diffused in the x direction and the z direction by the second anisotropic high heat conductor $2b_2$ and transferred to the heat sink 2. Therefore, it is possible to suppress an instantaneous temperature rise of the second chip $22b_1$ and the second chip $22b_2$.

As in the first embodiment, the high heat conductor immediately below the first chip $22a$ and the high heat conductor immediately below the second chip $22b_1$ and the second chip $22b_2$ are separated from each other. Therefore, the heat of the second chip $22b_1$ and the second chip $22b_2$ less easily flows into the region immediately below the first chip $22a$. Thus, the generated heat of the first chip $22a$ is efficiently diffused inside the first anisotropic high heat conductor $2a_1$ and the first anisotropic high heat conductor $2b_1$. Consequently, it is possible to suppress an instantaneous temperature rise of the first chip $22a$.

In this case, the first anisotropic high heat conductor $2a_1$ and the second anisotropic high heat conductor $2a_2$ have a role of spreading heat in the y direction. Therefore, even if the length in the x direction is set in accordance with the size of the wiring board 21 of the power module 20, the ability of spreading heat in the y direction is not hindered. Thus, the amount of high heat conductors to be used is reduced and therefore it is possible to reduce costs.

Note that, in the present embodiment as well, the layout arrangement of the heat-generating chips in the power module 20 is not limited to the configuration shown in FIG. 5 and can be the configurations shown in FIG. 2-1 to FIG. 2-5.

In the embodiments explained above, the anisotropic high heat conductor is configured to have a two-layer structure. However, it goes without saying that the anisotropic high heat conductor can be configured to have a multilayer structure having three or more layers, and with this configuration, it is possible to obtain more highly efficient heat radiation properties.

Fifth Embodiment.

Figure 6:
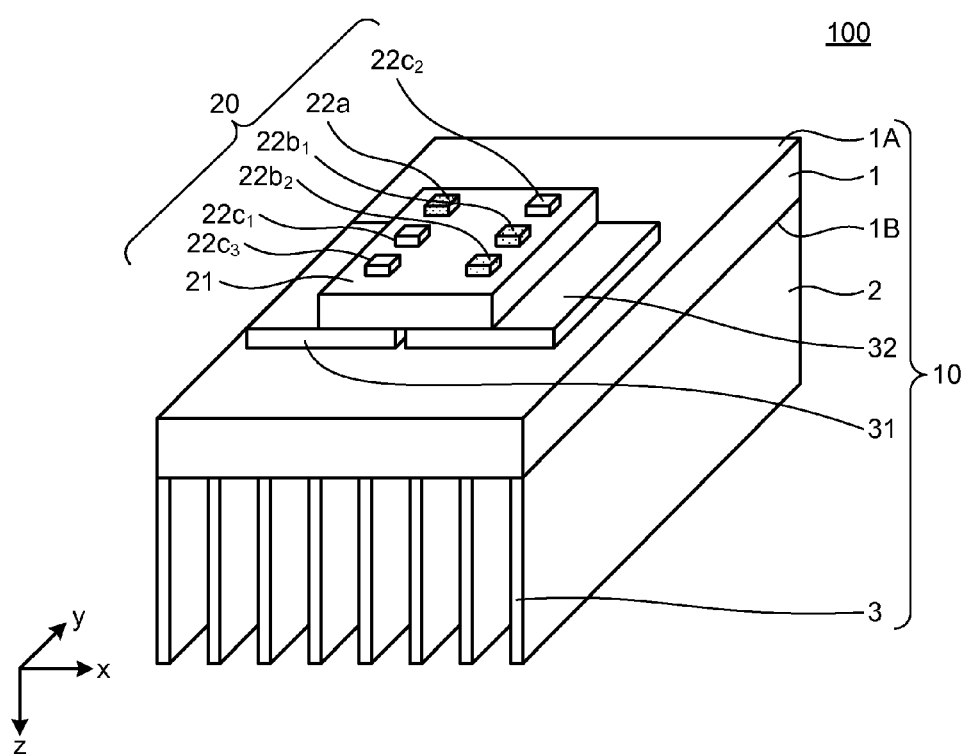
FIG. 6 is a perspective view showing a power module equipped with a cooling device according to a fifth embodiment of the present invention.

FIG. 6 is a perspective view of a power module equipped with a cooling device according to a fifth embodiment of the present invention. As shown in FIG. 6, the cooling device 10 includes the heat sink 2 configured from the flat fins 3 made of, for example, aluminum and the main body 1 including the base surface 1A. The power module 20 is provided on the base surface 1A. The flat fins 3 are provided on the flat fin formation surface 1B, which is a surface on the opposite side of the base surface 1A.

As in the first embodiment, six power semiconductor chips functioning as heat generating bodies are mounted on the power module 20. The power module 20 is configured from the first chip $22a$ having the largest amount of heat generation when heat generation is locally concentrated, the second chip $22b_1$ and the second chip $22b_2$ having the second largest amount of heat generation, and the third chips $22c_1$, $22c_2$, and $22c_3$ having the smallest amount of heat generation.

The chip layout is such that the first chip $22a$ and the second chip $22b_1$ and the second chip $22b_2$ are disposed not to be adjacent to each other and the first chip $22a$ is disposed adjacent to the third chips $22c_1$ and $22c_3$. The second chip $22b_1$ and the second chip $22b_2$ are not disposed along the row in the y direction in which the first chip $22a$ is included.

A first flat heat pipe 31 having a size equivalent to that of the wiring board 21 of the power module 20 in the y direction is provided immediately below the region including the first chip $22a$. A second flat heat pipe 32 having a size equivalent to that of the power module 20 in the y direction is provided immediately below the region including the second chips $22b_1$ and $22b_2$ and closely attached to the heat sink 2.

In such the cooling device 10, as in the first embodiment, according to the switching operation, the first chip $22a$ instantaneously and locally has the largest amount of heat generation, the second chip $22b_1$ and the second chip $22b_2$ have the second largest amount of heat generation, and the third chips $22c_1$, $22c_2$, and $22c_3$ hardly generate heat. Therefore, the generated heat of the first chip $22a$ is transferred to the first flat heat pipe 31 through the wiring board 21 of the power module 20, diffused in all of the x, y, and z directions, and transferred to the heat sink 2. Therefore, it is possible to suppress an instantaneous temperature rise of the first chip $22a$. The generated heat of the second chip $22b_1$ and the second chip $22b_2$ is transferred to the second flat heat pipe 32 through the power module 20, diffused in all of the x, y, and z directions, and transferred to the heat sink 2. Therefore, it is possible to suppress an instantaneous temperature rise of the second chips $22b_1$ and $22b_2$.

The first and second flat heat pipes 31 and 32 immediately below the first chip 22a and immediately below the second chip $22b_1$ and the second chip $22b_2$, respectively, are separated from each other. Therefore, when the amount of heat generation is instantaneously increases according to the switching operation, the heat of the second chip $22b_1$ and the second chip $22b_2$ is mainly diffused inside the second flat heat pipe 32. If the first and second flat heat pipes 31 and 32 are not separated from each other, because two chips, i.e., the second chip $22b_1$ and the second chip $22b_2$, generate heat and thus the heat generation area is large, the heat is easily diffused to the region immediately below the first chip 22a and this affects cooling of the first chip 22a. However, because the flat heat pipes are separated from each other, the heat of the second chip $22b_1$ and the second chip $22b_2$ less easily flows into the region immediately below the first chip. Therefore, the generated heat of the first chip 22a is efficiently diffused inside the first flat heat pipe 31. Consequently, it is possible to suppress an instantaneous temperature rise of the first chip 22a.

Note that the total amount of heat generation of the second chip $22b_1$ and the second chip $22b_2$ and the amount of heat generation of the first chip 22a are approximately the same. Therefore, heat quantities transferred to the separated flat heat pipes 31 and 32 are equivalent. Consequently, it is possible to uniformly diffuse heat to the entire heat sink 2 and thus it is possible to efficiently perform cooling.

Note that, in the present embodiment as well, the layout arrangement of the heat-generating chips in the power module 20 is not limited to the configuration shown in FIG. 6 and can be the configurations shown in FIG. 2-1 to FIG. 2-5.

Sixth Embodiment

Figure 7:
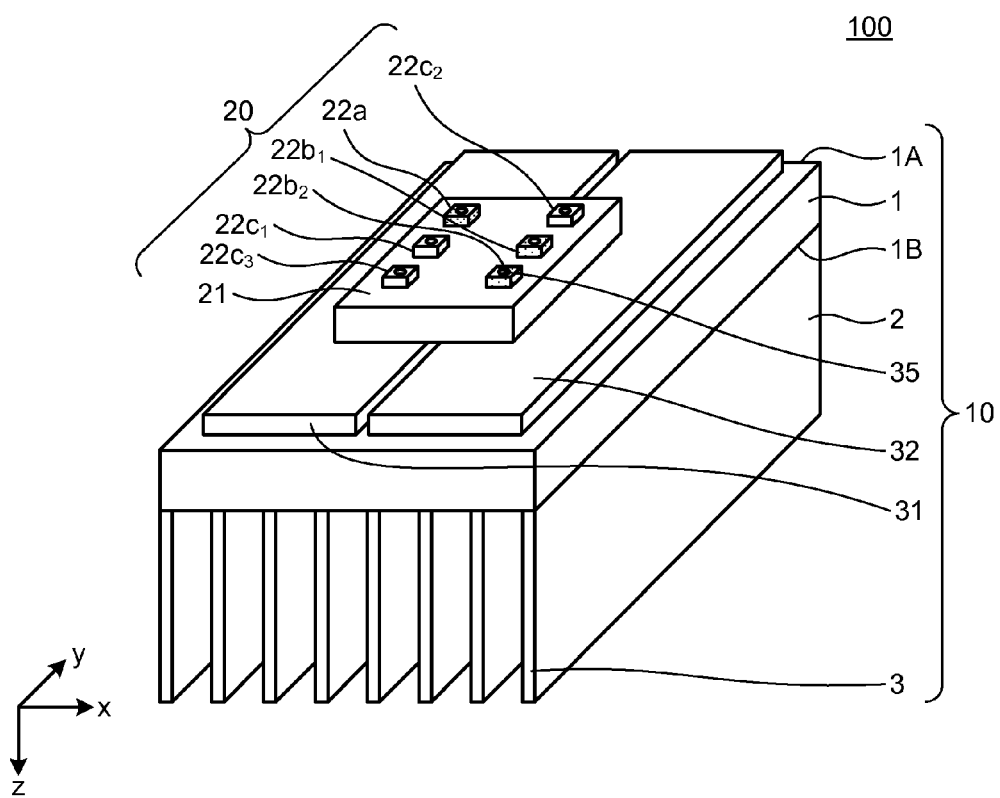
FIG. 7 is a perspective view showing a power module equipped with a cooling device according to a sixth embodiment of the present invention.

FIG. 7 is a perspective view of a cooling device according to a sixth embodiment of the present invention. As shown in FIG. 7, in the sixth embodiment, the first flat heat pipe 31 and the second flat heat pipe 32 having a size approximately equivalent to that of the heat sink in the y direction are disposed and closely attached to the heat sink 2.

Figure 8:
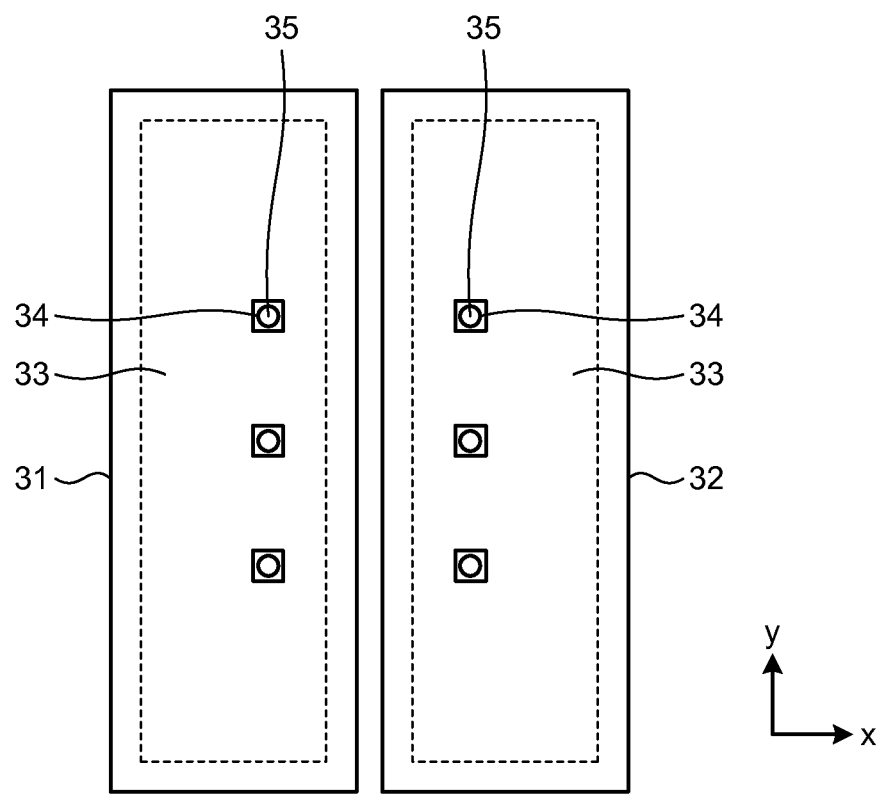
FIG. 8 is a plan view showing flat heat pipes according to the sixth embodiment of the present invention.

In this case, when the power module 20 is fixed to the heat sink 2 by screws, attachment holes 34 are provided avoiding steam channels 33 of the first flat heat pipe 31 and the second flat heat pipe 32 as shown in FIG. 8. Consequently, as shown in FIG. 7, it is possible to use the first flat heat pipe 31 and the second flat heat pipe 32 larger than the wiring board 21 of the power module 20. Screws 35 are inserted through the attachment holes 34 from the wiring board 21 side to fix the first flat heat pipe 31 and the second flat heat pipe 32 to the power module 20. Therefore, assembly is easy, adhesion is improved, and heat radiation properties are improved.

In such a cooling device 10, the generated heat of the first chip 22a is transferred to the first flat heat pipe 31 through the wiring board 21 of the power module 20, diffused in all of the x, y, and z directions, and transferred to the heat sink 2. Therefore, it is possible to suppress an instantaneous temperature rise of the first chip 22a. The generated heat of the second chip $22b_1$ and the second chip $22b_2$ is transferred to the second flat heat pipe 32 through the wiring board 21 of the power module 20, diffused in all of the x, y, and z directions, and transferred to the heat sink 2. Therefore, it is possible to suppress an instantaneous temperature rise of the second chip $22b_1$ and the second chip $22b_2$.

As in the fifth embodiment, the flat heat pipes immediately below the first chip 22a and immediately below the second chip $22b_1$ and the second chip $22b_2$, respectively, are separated from each other. Therefore, the heat of the second chip $22b_1$ and the second chip $22b_2$ less easily flows into the region immediately below the first chip 22a. Thus, the generated heat of the first chip 22a is efficiently diffused inside the first flat heat pipe 31. Consequently, it is possible to suppress an instantaneous temperature rise of the first chip 22a.

The size of the first flat heat pipe 31 and the second flat heat pipe 32 in the y direction is approximately equal to the size of the heat sink 2. Therefore, it is possible to diffuse the heat to the entire heat sink 2 and thus it is possible to efficiently perform cooling.

Note that, in the present embodiment as well, the layout arrangement of the heat-generating chips in the power module 20 is not limited to the configuration shown in FIG. 7 and can be the configurations shown in FIG. 2-1 to FIG. 2-5.

The first to sixth embodiments are the configuration in which the number of power semiconductor chips of the power module 20 is six. However, even when the number of power semiconductor chips is four or eight or more, it is satisfactory if the chip layout is such that a chip having the largest heat generation and a chip having the second largest heat generation are disposed not to be adjacent to each other, the chip having the largest heat generation and a chip having the smallest heat generation are disposed adjacent to each other, and the chip having the second largest heat generation is not disposed along the row in the y direction in which the chip having the largest heat generation is included.

Furthermore, the semiconductor chips only have to be designed to be grouped for each of the semiconductor chips having a large amount of heat generation such that the groups having a large amount of heat generation have heat diffusion routes independently from one another.

In the embodiments, an example has been explained in which the flat fins are mounted on the heat sink.

However, the shape or the presence or absence of the heat radiation fins can be selected as appropriate. It goes without saying that the configuration of the high heat conductors in the heat sink can also be changed. For example, the high heat conductors can be configured to have an integrated structure using an embedded structure of graphite or partially configured to have a modified structure to adjust the layout of a thermal conductive region.

INDUSTRIAL APPLICABILITY

As explained above, according to the present embodiment, it is possible to cool instantaneously generated heat in the entire heat sink; therefore, it is possible to suppress a temperature rise of the chips. Moreover, it is possible to disperse locally generated heat along the heat dispersion routes, such as right to left; therefore, it is possible to suppress interference among the chips. Furthermore, local heat generation does not occur between adjacent chips; therefore, it is possible to suppress an instantaneous temperature rise. Because of these characteristics, the cooling device is useful for mounting on a power module in which the amount of heat generation is likely to instantaneously increase.

REFERENCE SIGNS LIST 1 main body, 1A base surface, 1B flat fin formation surface, 2 heat sink, 3 flat fin, 10 cooling device, 20 power module, 21 wiring board, 22a first chip, $22b_1$, $22b_2$ second chip, $22c_1$, $22c_2$, $22c_3$ third chip, $2a_1$, $2b_1$ first anisotropic high heat conductor, $2a_2$, $2b_2$ second anisotropic high heat conductor, 31 first flat heat pipe, 32 second flat heat pipe, 33 steam channel, 34 attachment hole, 35 screw.

The invention claimed is:

1. A cooling device for cooling a power module including first and second chips that generate heat, the cooling device comprising a heat sink including a base surface on which the power module is closely attached and mounted, wherein
the heat sink includes:
a main body including the base surface; and
first and second high heat conductors that are each configured from a flat anisotropic high heat conductor having a high thermal conductivity in two directions among longitudinal, lateral, and depth directions and having a low thermal conductivity in one direction among the longitudinal, lateral, and depth directions and that have a thermal conductivity higher than a thermal conductivity of the main body,
the first and second high heat conductors are each configured from a stacked anisotropic high heat conductor having a two-layer structure arranged along the base surface of the heat sink,
a first layer is such that a direction in which a thermal conductivity is low is horizontal to a surface of the heat sink,
a second layer is stacked such that a direction in which a thermal conductivity is low is horizontal to the surface of the heat sink and is perpendicular to the direction in which a thermal conductivity is low in the first layer, and
the first and second chips are respectively in contact with one ends of the first and second high heat conductors via a wiring board and respectively connected to independent heat dispersion routes via the first and second high heat conductors.

2. The cooling device according to claim 1, wherein, in the stacked anisotropic high heat conductor having the two-layer structure, an area of a surface horizontal to the heat sink surface is different in the first layer and the second layer.

3. The cooling device according to claim 2, wherein, in the stacked anisotropic high heat conductor, the area of the surface horizontal to the heat sink surface is smaller in the first layer on a side closer to the power module than in the second layer.

4. A power module equipped with a cooling device comprising:
the cooling device according to claim 1; and
a power module that is closely attached to the base surface of the heat sink of the cooling device and includes first and second chips.

5. The power module equipped with a cooling device according to claim 4, further comprising one or more third chips in addition to the first and second chips, wherein
the first chip having a largest amount of heat generation and the second chip having a second largest amount of heat generation are arranged not to be adjacent to each other.

* * * * *